United States Patent [19]

Okazaki et al.

[11] Patent Number: 5,169,440
[45] Date of Patent: Dec. 8, 1992

[54] SILICON CARBIDE MEMBRANE FOR X-RAY LITHOGRAPHY AND METHOD FOR THE PREPARATION THEREOF

[75] Inventors: Satoshi Okazaki; Yoshihiro Kubota, both of Gunma, Japan

[73] Assignee: Shin-Etsu Chemical Co., Ltd., Tokyo, Japan

[21] Appl. No.: 448,717

[22] Filed: Dec. 11, 1989

[30] Foreign Application Priority Data

Dec. 14, 1988 [JP] Japan ................. 63-315768

[51] Int. Cl.$^5$ ............................................. H01L 21/02
[52] U.S. Cl. ............................. 106/286.1; 428/446; 428/698; 501/88
[58] Field of Search ............... 428/446, 698; 501/88; 430/57; 427/38, 39; 204/192.12, 192.15, 192.23, 192.37; 106/286.1

[56] References Cited

U.S. PATENT DOCUMENTS

| | | | |
|---|---|---|---|
| 4,359,372 | 11/1982 | Nagai et al. | 204/192.15 |
| 4,532,150 | 7/1985 | Endo et al. | 427/39 |
| 4,543,266 | 9/1985 | Matsuo et al. | 427/275 |
| 4,547,448 | 10/1985 | Shirai et al. | 430/57 |
| 4,604,292 | 8/1986 | Evans et al. | 430/967 |
| 4,608,326 | 8/1986 | Neakermang et al. | 428/698 |
| 4,737,379 | 4/1988 | Hudgens et al. | 127/39 |
| 4,941,942 | 7/1990 | Bruns et al. | 156/657 |

Primary Examiner—Ellis P. Robinson
Assistant Examiner—Archene Turner
Attorney, Agent, or Firm—McAulay Fisher Nissen Goldberg & Kiel

[57] ABSTRACT

A silicon carbide membrane suitable as a masking material in X-ray lithography is provided, which is free from the defects in the prior art products prepared by the chemical vapor deposition method such as pinholes and instability against irradiation with high-energy beams. The silicon carbide membrane is prepared by the deposition of a silicon carbide film on a silicon substrate by the method of sputtering using silicon carbide as the target material under specified atmospheric conditions, substrate temperature and power density on the target and removing the silicon substrate leaving the peripheral zone to serve as a frame.

1 Claim, 4 Drawing Sheets

SILICON CARBIDE MEMBRANE FOR X-RAY LITHOGRAPHY AND METHOD FOR THE PREPARATION THEREOF

BACKGROUND OF THE INVENTION

The present invention relates to a membrane of silicon carbide for X-ray lithography and a method for the preparation thereof. More particularly, the invention relates to a membrane of silicon carbide suitable as a masking film in X-ray lithography capable of withstanding intense irradiation with synchrotron radiation or electron beams as a powerful X-ray source.

Known masking materials for X-ray lithography typical in the prior art include (α-boron nitride):H, referred to as α-BN:H hereinbelow, disclosed in Japanese Patent Kohyo 55-500707, silicon nitride SiN disclosed in Japanese Patent Kokai 59-116750, polyimide resins disclosed in U.S. Pat. No. 4,037,111 and the like. None of these prior art membrane materials is quite satisfactory for the purpose due to the possible changes caused in the residual tensile stress when the membrane is irradiated with high energy beams such as synchrotron radiation as is reported in "30th International Symposium on Electron, Ion and Photon Beams", May 27–30, 1986, by W. A. Johnson, et al. On the other hand, silicon carbide is studied as a masking material. A silicon carbide film formed by the plasma-excited chemical vapor deposition method, referred to as the PECVD method hereinbelow, in a gaseous atmosphere of silane $SiH_4$ and methane $CH_4$, however, unavoidably contains a considerable amount of hydrogen so that the silicon carbide membrane prepared from such a vapor-deposited film contains a large number of defects and is subject to changes in the stress under irradiation with high-energy beams leading to formation of pinholes so that satisfactory membranes can hardly be prepared therefrom. Further, silicon carbide masks formed by the microwave ECR PECVD method are also disadvantageous due to the high content of hydrogen so as not to be free from the problem of a change in the stress under irradiation with high-energy beams.

SUMMARY OF THE INVENTION

The present invention accordingly has an object to provide a novel silicon carbide-based framed membrane suitable as a masking material in X-ray lithography containing substantially no hydrogen and free from any defects and pinholes with easy controllability of the stress by overcoming the above described problems and disadvantages in the prior art as well as to provide a method for the pre-paration of such a silicon carbide membrane.

Thus, the framed silicon carbide membrane of the present invention for X-ray lithography supported on a frame of silicon substrate is characterized by the infrared absorption spectrum having substantially no absorption band at a wave number of around 2100 $cm^{-1}$, which is ascribable to hydrogen contained therein, and the tensile stress not exceeding $5 \times 10^9$ $dyn/cm^2$.

The above defined silicon carbide membrane of the invention can be prepared by depositing a silicon carbide film on a substrate of silicon in a sputtering method using a target electrode made of silicon carbide, in which the silicon substrate is kept at a temperature not exceeding 500° C. in an atmosphere of a rare gas, such as argon and xenon, under a pressure in the range from 0.01 Torr to 0.1 Torr and then separating the silicon carbide film from the silicon substrate leaving the peripheral zone to serve as a frame.

DETAILED DESCRIPTION OF THE PREFERRED EMBODIMENTS

Figure 1:
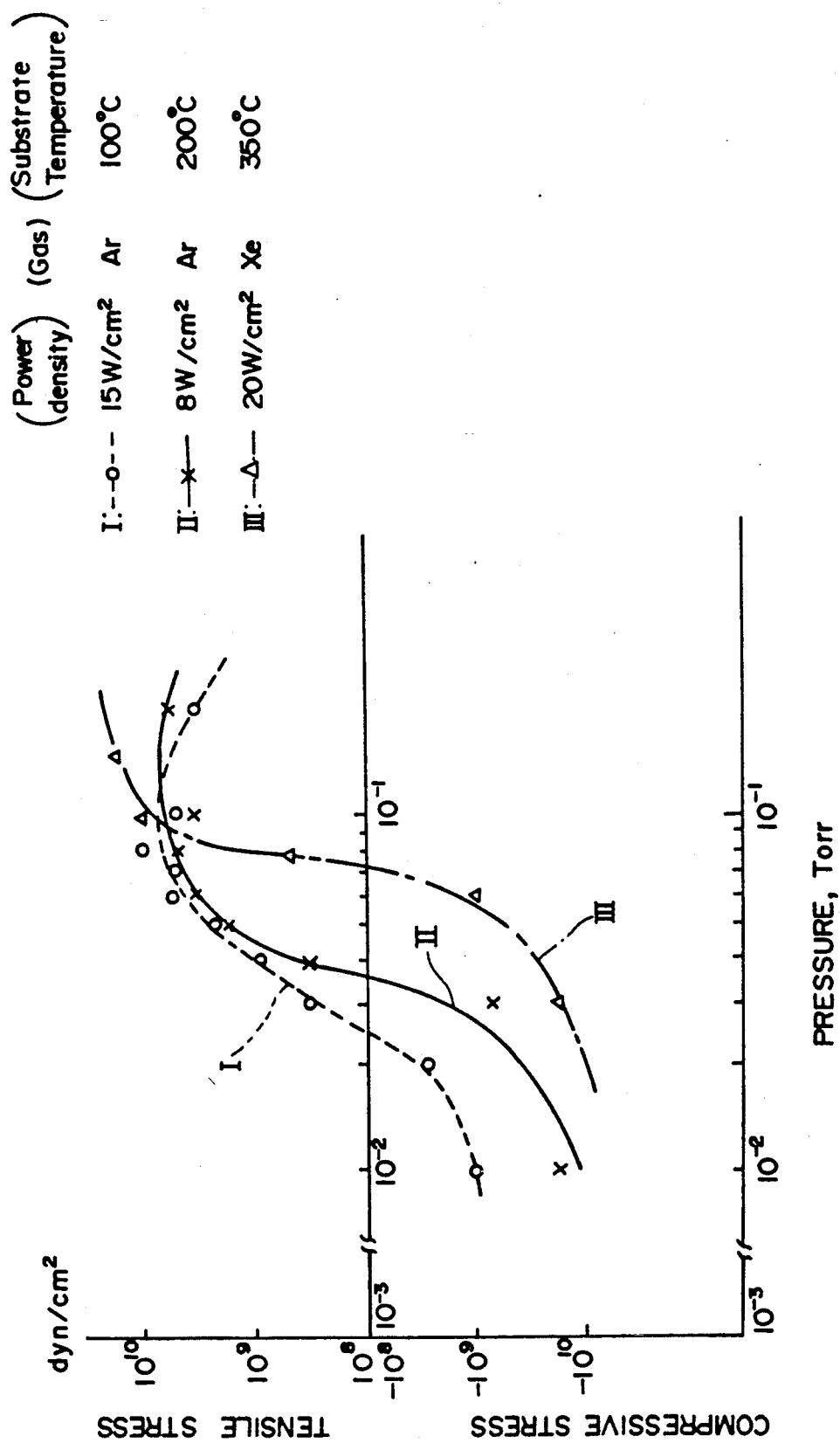
FIGS. 1, 2 and 3 graphically illustrate the tensile stress in the silicon carbide films as a function of the pressure of the atmosphere in which sputtering is performed, power density for sputtering and temperature of the substrate, respectively.

The above described invention relating to a novel framed silicon carbide membrane for X-ray lithography and the method for the preparation thereof has been completed as a result of the extensive investigations undertaken by the inventors who directed their attention to the sputtering method never undertaken in the prior art and conducted experiments to find optimum conditions for sputtering such as the target material, atmospheric gas, pressure of the sputtering atmosphere, temperature of the substrate and so on which could provide a silicon carbide membrane substantially free from hydrogen content and having no pinholes with controllability of the stress to be capable of withstanding irradiation with high-energy beams.

The sputtering method of the invention can be performed according to any of conventional procedures without particular limitations excepting the above defined conditions although the magnetron sputtering method is preferable in respect of the high rate of silicon carbide film deposition to give good productivity. The material of the target electrode is silicon carbide preferably having a purity of at least 99%. The substrate on which the silicon carbide film is deposited is a silicon wafer and the temperature thereof should be kept not to exceed 500° C. in order to minimize the impurity level in the deposited silicon carbide film. Deposition of the silicon carbide film thereon can proceed even at room temperature but a temperature in the range from 100° to 500° C. is preferred. The atmosphere for sputtering is kept under a reduced pressure by passing a rare gas, such as argon and xenon, through the sputtering chamber. Control of the pressure in the sputtering atmosphere is important in order to control the stress in the silicon carbide film below $5 \times 10^9$ $dyn/cm^2$ which is the upper limit of the stress not to cause spontaneous breaking of the silicon carbide membrane prepared from the deposited silicon carbide film. In this regard, a preferable range of the atmospheric pressure is from 0.01 Torr to 0.1 Torr. The power density on the target electrode should be at least 5 watts/$cm^2$ in order to obtain controllability of the stress in the silicon carbide film as well as to ensure a high rate of silicon carbide deposition.

When deposition of the silicon carbide film is conducted by the sputtering method under the above described conditions, the film has a controlled stress not exceeding $5 \times 10^9$ $dyn/cm^2$ which is the upper limit of stress not to cause spontaneous breaking of the unsupported but framed silicon carbide membrane prepared from the deposited film. The method for the measurement of the residual tensile stress in such a deposited film is well known in the art. Namely, the value of stress can be calculated from the amount of warping of the silicon substrate using several parameters relating to the physical properties of the silicon substrate and the like. The membrane contains substantially no hydrogen which can be detected and determined by the infrared absorption spectrophotometry. Namely, the infrared absorption spectrum of the membrane has substantially no absorption band at a wave number of around 2100 $cm^{-1}$ ascribable to the hydrogen contained in silicon carbide or, in particular, the peak area of the above mentioned absorption band is not exceeding 0.1% of the peak area of the absorption band at a wave number of around 800 $cm^{-1}$. Microscopic examination of the membrane serves to assure complete absence of pinholes in the thus prepared silicon carbide membrane. Thus, the silicon carbide membrane can well withstand irradiation with high-energy beams.

Following is a description of a typical procedure for the preparation of a framed silicon carbide membrane from the silicon carbide film deposited on the silicon substrate. Thus, the silicon substrate having a silicon carbide film deposited on one surface by the sputtering method under the specified conditions is provided on the other surface with a resist layer of, for example, (α-boron nitride):H by a suitable method such as the PECVD method and the like. An annular mask made of stainless steel is put on the resist layer and the resist layer is removed from the unmasked circular area by the plasma-excited dry etching method in a gaseous mixture of carbon tetrafluoride containing 4% by volume of oxygen so as to expose the surface of silicon unprotected. Thereafter, the silicon substrate in the unprotected area is removed away by etching in a hot aqueous solution containing 25% by weight of potassium hydroxide at 90° C. leaving the peripheral annular zone to serve as a frame of the membrane so that a framed silicon carbide membrane is obtained with an annular frame of the silicon substrate around the unsupported circular area.

The silicon carbide membrane prepared in the above described manner usually has a flatness within plane (Bow) of 1 μm or smaller. Further, the stress in the silicon carbide membrane is very stable with absolutely no changes by the irradiation with high-energy electron beams at an accelerating voltage of 10 kV up to an irradiation dose of 1 $GJ/cm^3$.

In the following, examples are given to illustrate the invention in more detail but not to limit the scope of the invention in any way.

EXAMPLE 1

A silicon carbide wafer of 3 inch diameter having a purity of 99.9% was set as the target on the cathode of a high-frequency magnetron-sputtering apparatus (Model SPF-332H, manufactured by Nichiden Anerba Co.) and a 2-inch diameter silicon wafer as the substrate having a thickness of 1 mm set in the sputtering chamber was heated at a temperature of 100° C. Argon gas was passed through the sputtering chamber at a flow rate of 5 ml/minute so as to keep the pressure inside the chamber at 0.040 Torr by the balance with continued evacuation. A direct-current voltage was applied to the electrodes at a power density on the target electrode of 15 watts/$cm^2$ for 20 minutes so that a silicon carbide film was deposited on the silicon substrate at a rate of 55 nm/minute.

A silicon carbide membrane was obtained from the thus deposited silicon carbide film on the silicon substrate in the following manner. Thus, the silicon substrate having the silicon carbide film deposited on one surface is provided on the other surface with a resist layer of α-BN:H having a thickness of 0.5 μm by the PECVD method. An annular mask of stainless steel having an outer diameter of 50 mm, inner diameter of 30 mm and thickness of 0.3 mm was put on the α-BN:H layer and the layer on the unmasked area was removed away by dry etching in plasma using a gaseous mixture of 96% by volume of carbon tetrafluoride and 4% by volume of oxygen so as to expose the surface of the silicon substrate in the circular area of 30 mm diameter. Thereafter, the silicon substrate on the thus exposed area was removed away by etching in a hot aqueous solution containing 25% by weight of potassium hydroxide at 90° C. so that a silicon carbide membrane having a thickness of about 1.1 μm and supported with an annular frame was obtained. Substantially no pinholes could be detected therein by a microscopic inspection of 400 magnifications. The silicon carbide membrane was safe from the corrosive attack of the potassium hydroxide solution.

Figure 4:
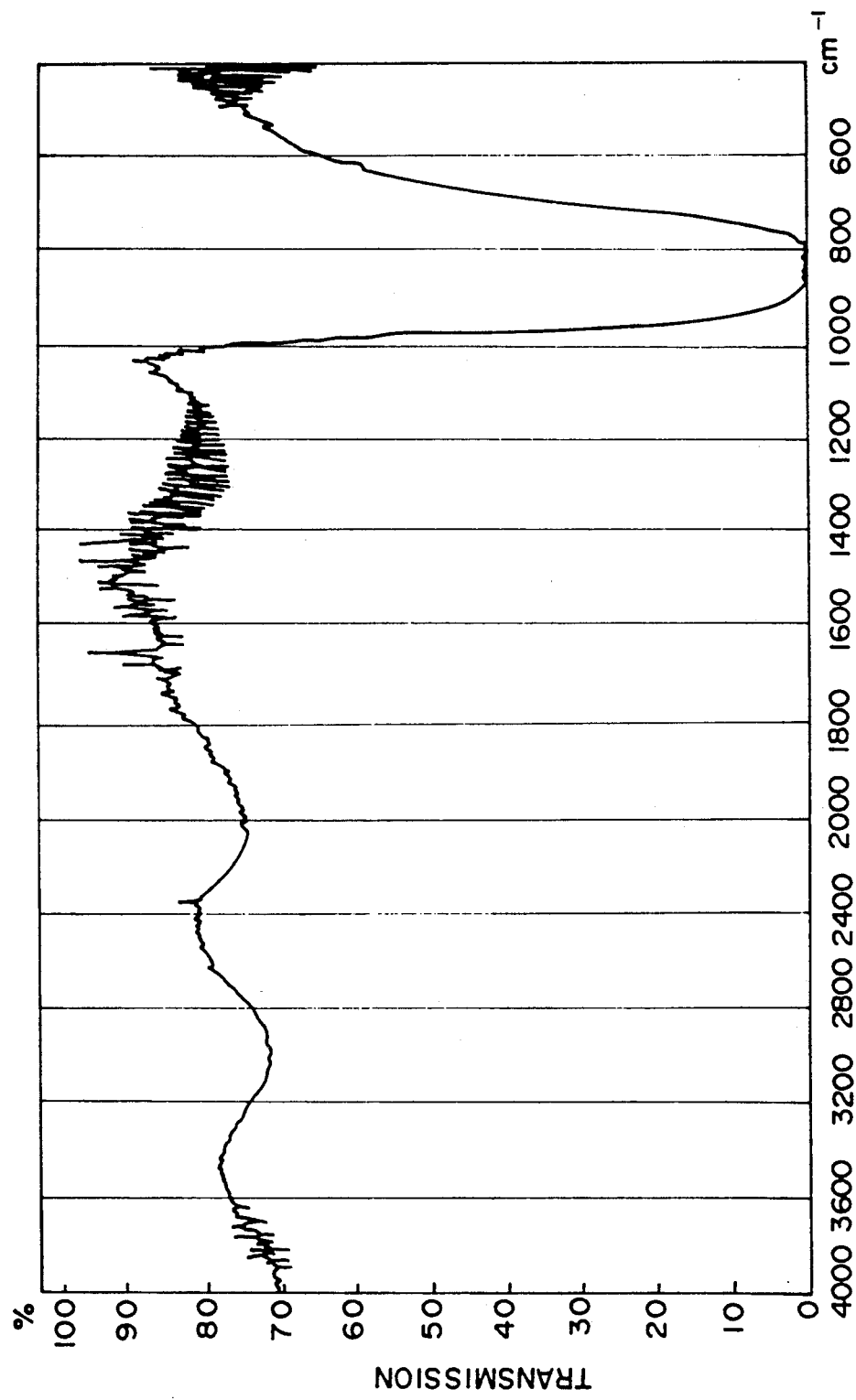
FIG. 4 is an infrared absorption spectrum of the silicon carbide membrane prepared in Example 1 according to the invention.
Figure 5:
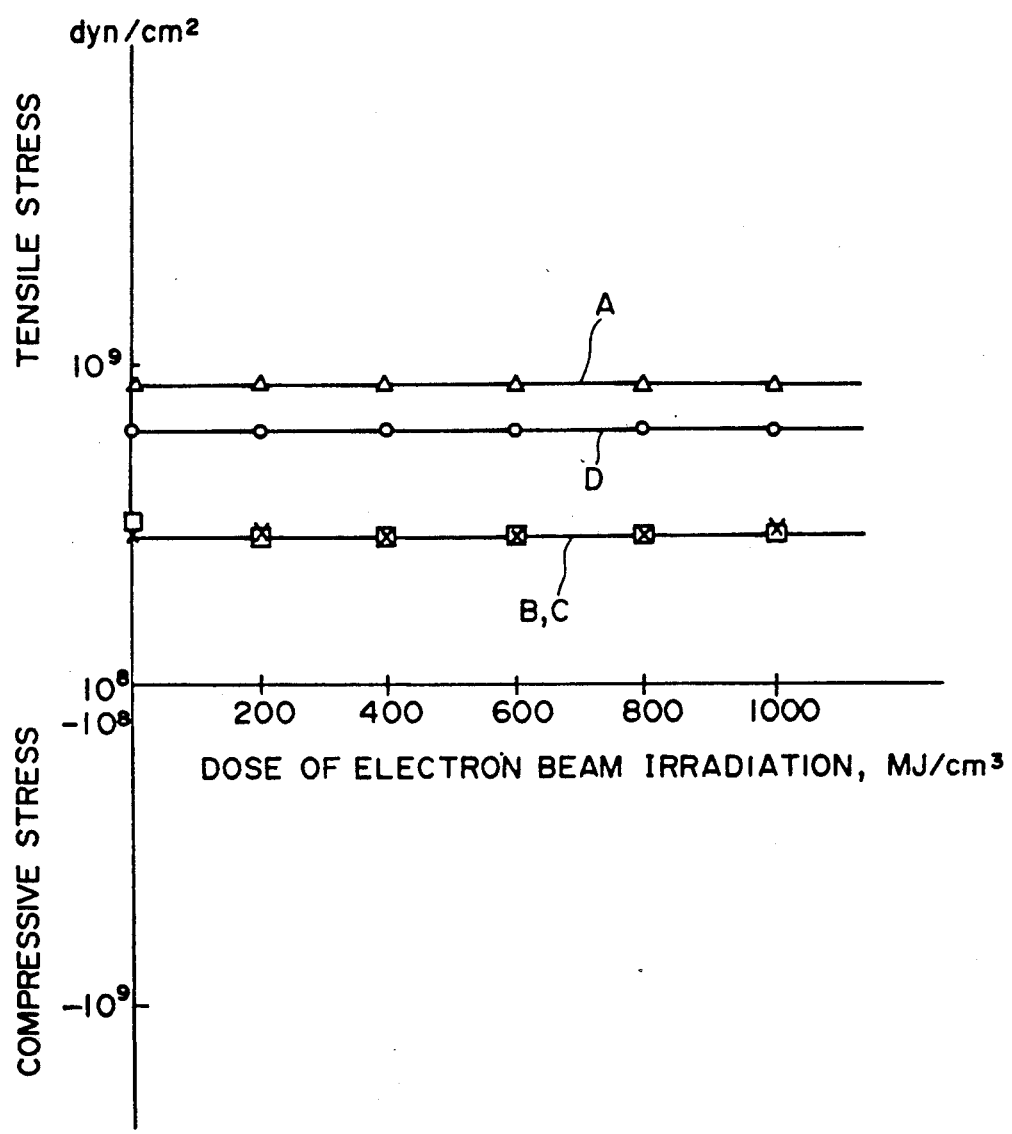
FIG. 5 shows changes in the stress of the silicon carbide membranes prepared in the example as a function of the irradiation dose with electron beams.

The thus prepared silicon carbide membrane was subjected to various tests to give the results including:
residual tensile stress of $9.2 \times 10^8$ dyn/$cm^2$;
substantial absence of the infrared absorption band at a wave number of around 2100 $cm^{-1}$ as is illustrated in FIG. 4;
flatness within plane (BOW) of smaller than 1 μm; and
absolutely no influences by the irradiation with 10 kV electron beams up to a dose of 1000 MJ/$cm^3$ as is shown by the curve A in FIG. 5.

EXAMPLE 2

The experimental procedure was substantially the same as in Example 1 except that the pressure of the sputtering atmosphere was kept at 0.030 Torr instead of 0.040 Torr so that deposition of the silicon carbide film on the silicon substrate proceeded at a rate of 60 nm/minute to give a film thickness of about 1.2 μm.

The results of testing of the silicon carbide membrane prepared from the thus deposited film were substantially the same as in Example 1 except that the residual tensile stress was $3.6 \times 10^8$ dyn/$cm^2$ instead of $9.2 \times 10^8$ dyn/$cm^2$. The influence of the electron beam irradiation on the tensile stress is shown by the curve B in FIG. 5.

EXAMPLE 3

The experimental procedure was substantially the same as in Example 1 except that the temperature of the substrate was increased to 200° C. and the power density on the target was 8 watts/$cm^2$ instead of 15 watts/$cm^2$ so that deposition of the silicon carbide film on the silicon substrate proceeded at a rate of 40 nm/minute to give a film thickness of about 0.8 μm.

The results of testing of the silicon carbide membrane prepared from the thus deposited film were substantially the same as in Example 1 except that the residual tensile stress was $3.6 \times 10^8$ dyn/$cm^2$ instead of $9.2 \times 10^8$ dyn/$cm^2$. The influence of the electron beam irradiation on the tensile stress is shown by the curve C in FIG. 5.

EXAMPLE 4

The experimental procedure was substantially the same as in Example 1 except that the temperature of the substrate was increased to 350° C., the atmospheric gas was xenon at a flow rate of 8 ml/minute instead of argon, the pressure of the sputtering atmosphere was kept at 0.080 Torr instead of 0.040 Torr and the power density on the target was 20 watts/cm$^2$ instead of 15 watts/cm$^2$ so that deposition of the silicon carbide film on the silicon substrate proceeded at a rate of 55 nm/minute to give a film thickness of about 1.1 μm.

The results of testing of the framed silicon carbide membrane prepared from the thus deposited film were substantially the same as in Example 1 except that the residual tensile stress was $6.4 \times 10^8$ dyn/cm$^2$ instead of $9.2 \times 10^8$ dyn/cm$^2$. The influence of the electron beam irradiation on the tensil stress is shown by the curve D in FIG. 5.

EXAMPLE 5

Three series of experiments were undertaken each under substantially the same conditions as in Examples 1, 3 and 4, respectively, except that the pressure in the sputtering atmosphere was varied but kept constant throughout each experiment to examine the influence of the pressure of sputtering atmosphere on the residual tensile stress in the framed silicon carbide membranes. The curves I, II and III in FIG. 1 show the results obtained in these series of experiments including Examples 1 and 2, Example 3 and Example 4, respectively.

EXAMPLE 6

Figure 2:
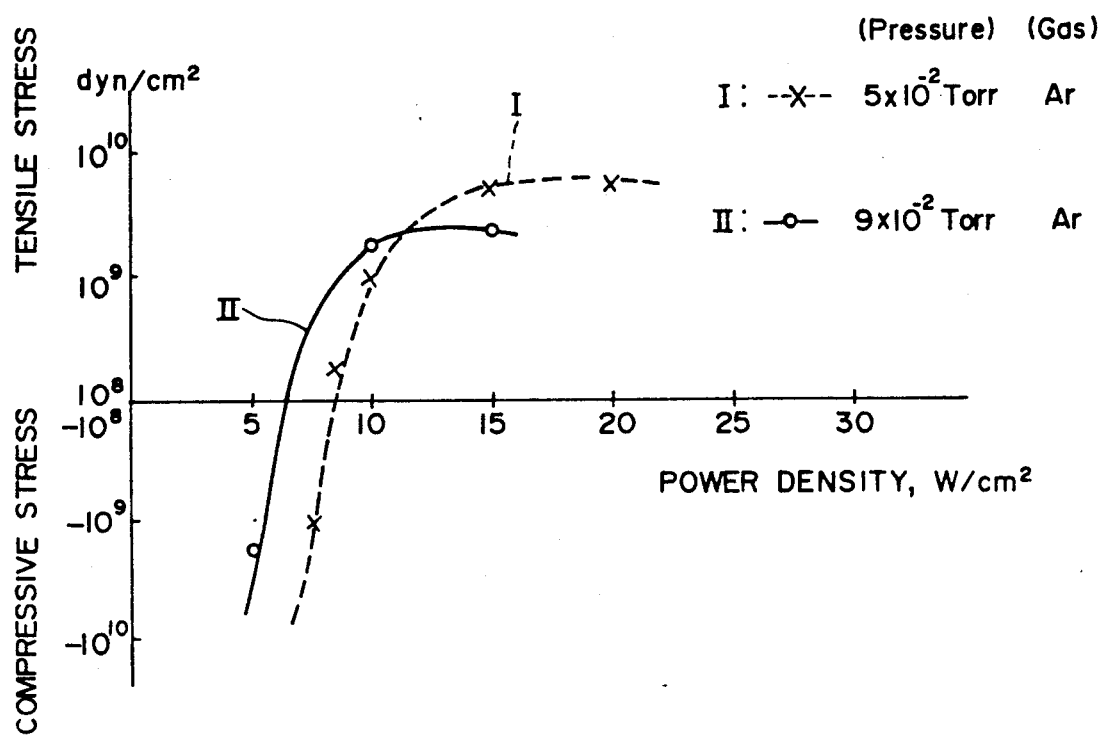

Two series of experiments were undertaken except that the pressure in the sputtering atmosphere was kept at 0.05 Torr or 0.09 Torr, respectively, and the power density on the target was varied but kept constant throughout each experiment to examine the influence of the power density on the residual tensile stress in the silicon carbide membranes. The curves I and II in FIG. 2 show the results obtained in these series of experiments with the pressure of 0.05 Torr and 0.09 Torr, respectively.

EXAMPLE 7

Figure 3:
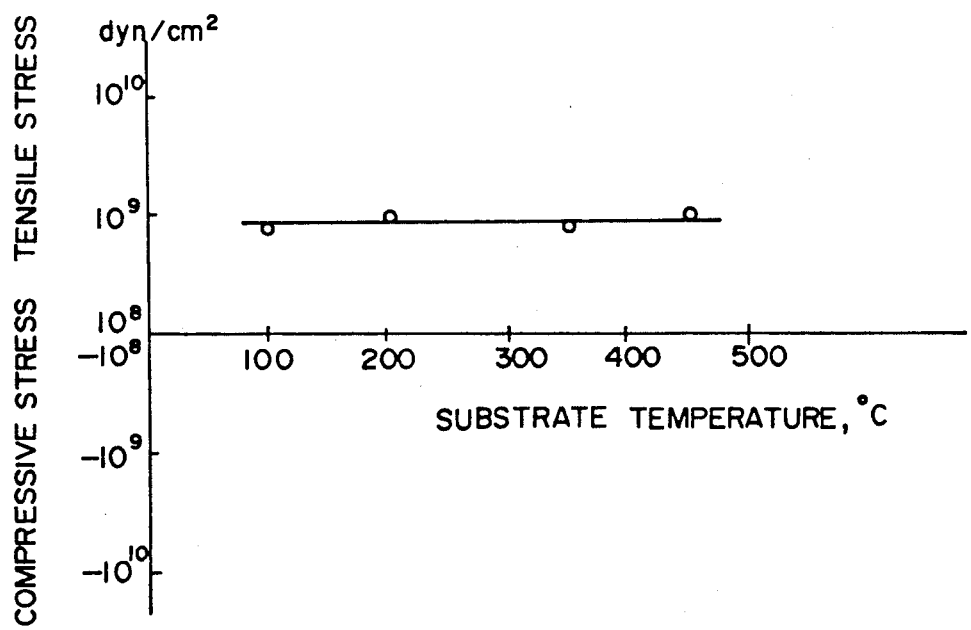

A series of experiments were undertaken under substantially the same conditions as in Example 1 except that the temperature of the substrate was varied but kept constant throughout each experiment to examine the influence of the substrate temperature on the residual tensile stress in the framed silicon carbide membranes. The results are shown in FIG. 3.

What is claimed is:
1. A silicon carbide membrane for X-ray lithography having an infrared absorption spectrum with substantially no absorption band at a wave number of around 2100 cm$^{-1}$ and a residual tensile stress not exceeding $5 \times 10^9$ dyn/cm$^2$.

* * * * *